United States Patent [19]
Mukerji et al.

[11] Patent Number: 6,093,583
[45] Date of Patent: Jul. 25, 2000

[54] SEMICONDUCTOR COMPONENT AND METHOD OF MANUFACTURE

[75] Inventors: Prosanto K. Mukerji, Phoenix; Rajesh Srinivasan, Scottsdale; Ronald E. Thomas, Tempe; Colin B. Bosch, Phoenix, all of Ariz.; Peter J. Gillespie, Chagrin Falls, Ohio

[73] Assignee: Semiconductor Components Industries, LLC, Phoenix, Ariz.

[21] Appl. No.: 09/087,990

[22] Filed: Jun. 1, 1998

[51] Int. Cl.[7] .......................... H01L 21/44; H01L 21/48; H01L 21/50
[52] U.S. Cl. ......................... 438/113; 438/106; 438/110
[58] Field of Search .................................. 438/113, 110, 438/106

[56] References Cited

U.S. PATENT DOCUMENTS

| 5,348,913 | 9/1994 | McBride et al. . |
| 5,413,955 | 5/1995 | Lee et al. . |
| 5,557,149 | 9/1996 | Richards et al. . |
| 5,721,162 | 2/1998 | Schubert et al. . |

*Primary Examiner*—Kevin M. Picardat
*Assistant Examiner*—D. M. Collins
*Attorney, Agent, or Firm*—Robert D. Atkins

[57] ABSTRACT

A method of manufacturing a semiconductor component includes applying an encapsulant (211) to a wafer (210, 430), degassing the encapsulant (211), and separating the wafer (210, 430) into a plurality of semiconductor components. Manufactured in this manner, the encapsulant (211) of the semiconductor component is substantially devoid of air bubbles and voids.

19 Claims, 3 Drawing Sheets

SEMICONDUCTOR COMPONENT AND METHOD OF MANUFACTURE

BACKGROUND OF THE INVENTION

This invention relates, in general, to electronics, and more particularly, to semiconductor components and methods of manufacture.

Semiconductor devices manufactured in a semiconductor wafer according to a process described in U.S. Pat. No. 5,557,149, issued on Sep. 17, 1996, eliminate the need for a leadframe. These devices can be packaged at wafer level before the individual devices are sawed apart or otherwise singulated from the wafer. The wafer level packaging process includes stencil printing an encapsulant over the semiconductor wafer, using centrifugal forces to eliminate air pockets in the encapsulant, attaching a capping wafer to the semiconductor wafer, and curing the encapsulant.

However, this wafer level packaging process has several problems. First, the centrifugal process does not eliminate all of the air pockets or voids from the encapsulant. The voids are commonly formed above the semiconductor wafer and in isolation trenches etched into the semiconductor wafer. The severity of this void formation problem increases with larger diameter wafers. A second problem stems from the thickness of the wafer-encapsulant-cap assembly or structure being non-uniform between different wafers and within the same wafer. The lack of thickness control produces the unacceptable thickness variations. Third, the wafer-encapsulant-cap assembly often warps because of the high stress levels in the assembly. This problem is also intensified in larger diameter wafers and after thinning the device wafer during the later stages of processing. Inconsistent thicknesses between the wafer-encapsulant-cap assemblies and thickness variations within a single assembly can significantly impact the warpage of the wafer-encapsulant-cap assembly. The assembly warpage causes handling and processing problems. A fourth problem stems from the poor adhesion between the encapsulant and the wafer, which produces poor reliability.

Therefore, a need exists for a semiconductor component and method of manufacture that eliminates voids in the encapsulant, that uniformly controls the thickness or height of the semiconductor component, that does not produce warped wafers, and that has improved adhesion between the encapsulant and the wafer.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
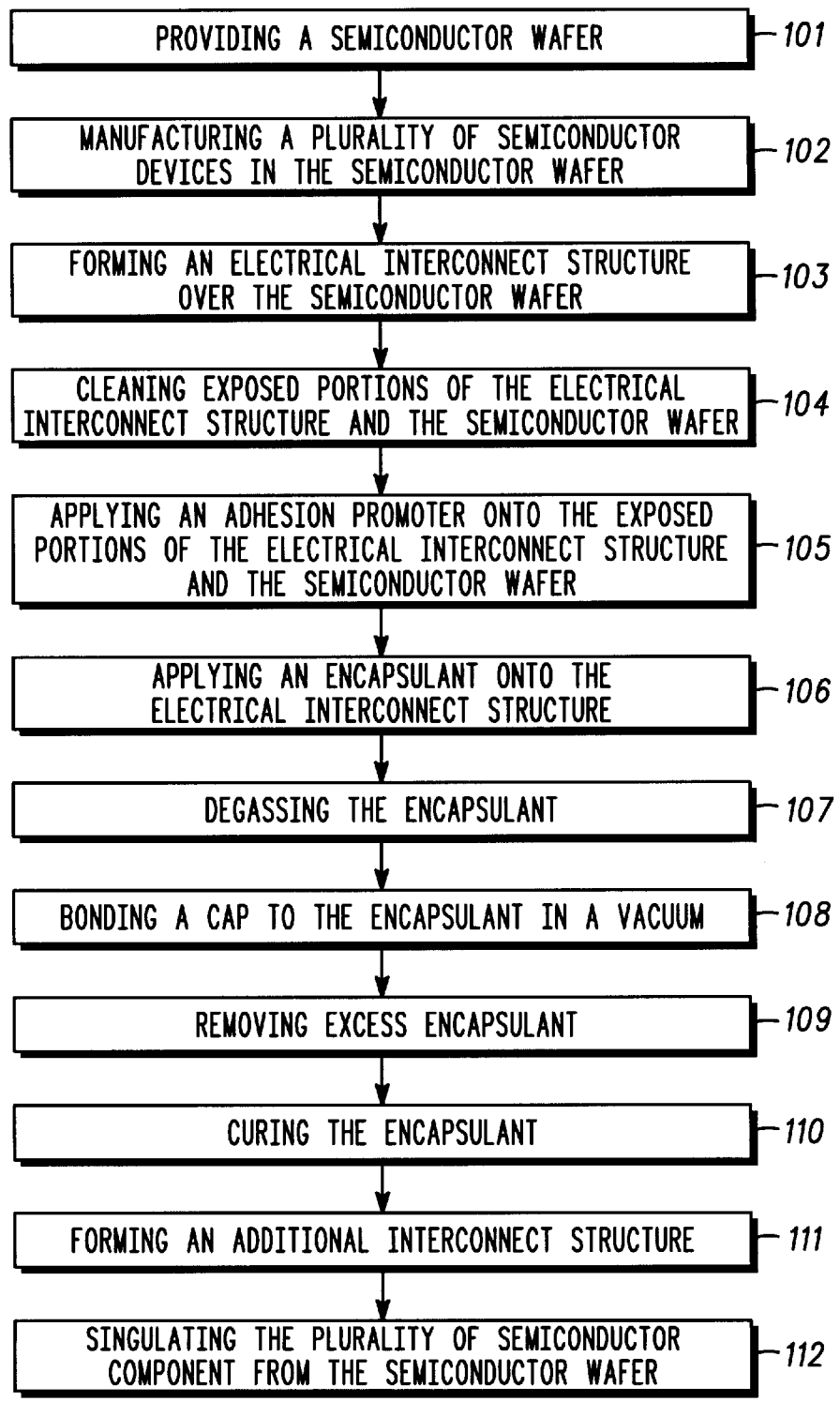
FIG. 1 outlines a method of manufacturing semiconductor components in accordance with the present invention.

FIG. 1 outlines a method 100 of manufacturing semiconductor components. Method 100 begins with a step 101 for providing a semiconductor wafer and continues with a step 102 for manufacturing a plurality of semiconductor devices in the semiconductor wafer. Step 102 includes, among other features, doping portions of the semiconductor wafer, photolithography processing of the semiconductor wafer, etching the semiconductor wafer, forming metal electrodes on the intrinsic devices in the semiconductor wafer, and depositing a dielectric layer on the semiconductor wafer. Method 100 continues with a step 103 for forming an electrical interconnect structure over the semiconductor wafer for the purpose of bringing the contacts from the formed electrodes to the printed wiring board. Step 103 involves utilizing additional regions of the semiconductor wafer that do not have intrinsic devices and that only act as contact pads to aid interconnection support to the intrinsic devices. Step 103 includes, among other features, forming metallic interconnects from the electrodes over to the contact pads. Step 103 involves depositing metallic layers over the semiconductor wafer, etching the metallic layers in a patterned manner to form patterned metallic interconnect layers, and etching the semiconductor wafer to provide electrical isolation between the active region or intrinsic devices of the semiconductor wafer and the other regions of the semiconductor wafer acting as contact pads. Step 103 can optionally include thinning the backside of the semiconductor wafer to a desired thickness before or after depositing a metallic layer over the front side of the semiconductor wafer and etching the front side to produce the above mentioned isolation. After step 103, certain metallic portions of the electrical interconnect structure remain exposed.

A step 104 of method 100 cleans the exposed portions of the electrical interconnect structure and the semiconductor wafer by removing organic films and other contaminants from the exposed portions. Step 104 can include irradiating or otherwise exposing the electrical interconnect structure and the semiconductor wafer to ultraviolet light in an air ambient for approximately ten minutes. The ultraviolet light converts some of the oxygen molecules in the air to ozone, which under the influence of ultraviolet radiation decomposes into oxygen and oxygen radicals. The oxygen radicals attack and remove the organic contaminants. The ultraviolet light can heat the air, the semiconductor wafer, and the electrical interconnect structure to a temperature of approximately forty to eighty degrees Celsius. The ultraviolet light and ozone cleaning process is most suitable for an electrical interconnect structure comprising gold interconnect lines or electrodes.

Next, a step 105 of method 100 disposes an adhesion promoter onto the exposed portions of the electrical interconnect structure and the semiconductor wafer. The adhesion promoter improves or enhances the adhesion between the electrical interconnect structure and a subsequently applied encapsulant. When the electrical interconnect structure is comprised of gold, step 105 can comprise a spin coat of a one half percent solution of triethoxy-3-propylmercaptan and thermal drying at approximately one hundred degrees Celsius.

Then, method 100 continues with a step 106 for applying an encapsulant or packaging material onto the electrical interconnect structure. As an example, step 106 can include stencil printing a resin selected from the group consisting essentially of silicone, polyimide, or epoxy onto the electrical interconnect structure and semiconductor wafer. The encapsulant should have a low viscosity and should have a post-cure hardness that is optimized for supporting the semiconductor wafer and for preventing wafer warpage. The low viscosity enables the encapsulant to flow into the etched regions of silicon underneath the patterned electrical interconnect structures providing electrical isolation between the active regions and the contact pad regions of the semiconductor wafer. An encapsulant having a low thixotropic index of less than approximately two is beneficial for the removal of air trapped in the encapsulant. The thixotropic index is not a requirement for conventional semiconductor device encapsulants. The encapsulant should also have commonly desired characteristics for encapsulants that are used to package semiconductor devices. In the preferred embodiment, step 106 uses a quartz filled silicone resin, such as product number 1225-06-109 from General Electric of Scenectedy, N.Y. The flexibility of the silicone resin reduces the likelihood of wafer warpage.

Next, a step 107 of method 100 degasses the encapsulant. The degassing can be accomplished by heating the encapsulant or placing the encapsulant in a vacuum or both. In the preferred embodiment where the encapsulant comprises the silicone resin, the heating temperature is approximately fifty to eighty degrees Celsius and is held for approximately one to five minutes. The semiconductor wafer, electrical interconnect structure, and encapsulant can be placed into a vacuum chamber during step 107. A vacuum environment of approximately $1 \times 10^{-3}$ Torr assists in evacuating the air bubbles or voids from the encapsulant. The previously described low thixotropic index also facilitates the degassing process.

Afterwards, a step 108 of method 100 bonds a cap to the encapsulant. A cap can be comprised of a rigid material like quartz, silicon, or the like. The cap can alternatively be comprised of a soft material like a fiber reinforced prepreg, a fiber reinforced laminate, a thermoplastic film, or the like. This bonding or capping process preferably occurs in a vacuum similar to that of step 107 to prevent the trapping of air underneath the patterned electrical interconnects and to prevent void formation in the encapsulant between the cap and the device wafer. The cap can be applied to the encapsulant by pressing from one edge of the cap to an opposite edge of the cap or by pressing from the center of the cap towards the perimeter of the cap. These two cap application methods also reduce the likelihood of forming voids between the cap and the encapsulant. Void formation between the cap and the encapsulant can also be avoided by pre-treating the encapsulant with a silane coupling agent that acts as a wetting agent. The encapsulant couples the cap to the electrical interconnect structure and the semiconductor wafer. In the preferred embodiment, the encapsulant has a thickness of approximately one hundred micrometers after the bonding process of step 108.

The capping process can use up to approximately twenty to two hundred fifty kilograms of force to ensure that the cap is affixed to the encapsulant. The force is exerted under an elevated temperature on the order of approximately eighty to one hundred degrees Celsius. The force is applied for a duration of approximately one to five minutes under these conditions. This force repeatably and reproducibly produces wafer-encapsulant-cap-structures having a uniform thickness.

Then, method 100 continues with a step 109 for cleaning off or removing any excess encapsulant from an edge of the semiconductor wafer after the bonding or capping process of step 108. The force exerted on the cap during step 108 can expel or squeeze some of the encapsulant out from between the wafer and the cap. In the preferred embodiment where the wafer is subsequently processed in automated wafer handling tools, the perimeter of the wafer, including the wafer flat, should be clearly defined and should not be obscured or distorted by any excess encapsulant.

A step 110 of method 100 cures the encapsulant after the cleaning step of step 109. In the preferred embodiment, the curing process occurs at temperatures of approximately one hundred forty to one hundred seventy degrees Celsius for approximately fifteen to sixty minutes.

A step 111 of method 100 then involves process steps such as etching silicon and forming interconnects to bring the electrical contacts to the backside of the wafer. A step 112 of method 100 then singulates the plurality of packaged semiconductor devices from the semiconductor wafer. The singulating step can use sawing, scribing, laser, or other similar techniques to separate the packaged semiconductor devices into individual components.

Process steps 107 and 108 in method 100 determine the uniformity and thickness variability of the wafer-encapsulant-cap structure as well as the amount of voids, if any, entrapped in the structure. The control of steps 107 and 108 determines the quality of the encapsulation process and the usability of the wafer-encapsulant-cap structure during steps 111 and 112, during subsequent reliability tests, and during the service life of the individual devices.

Figure 2:
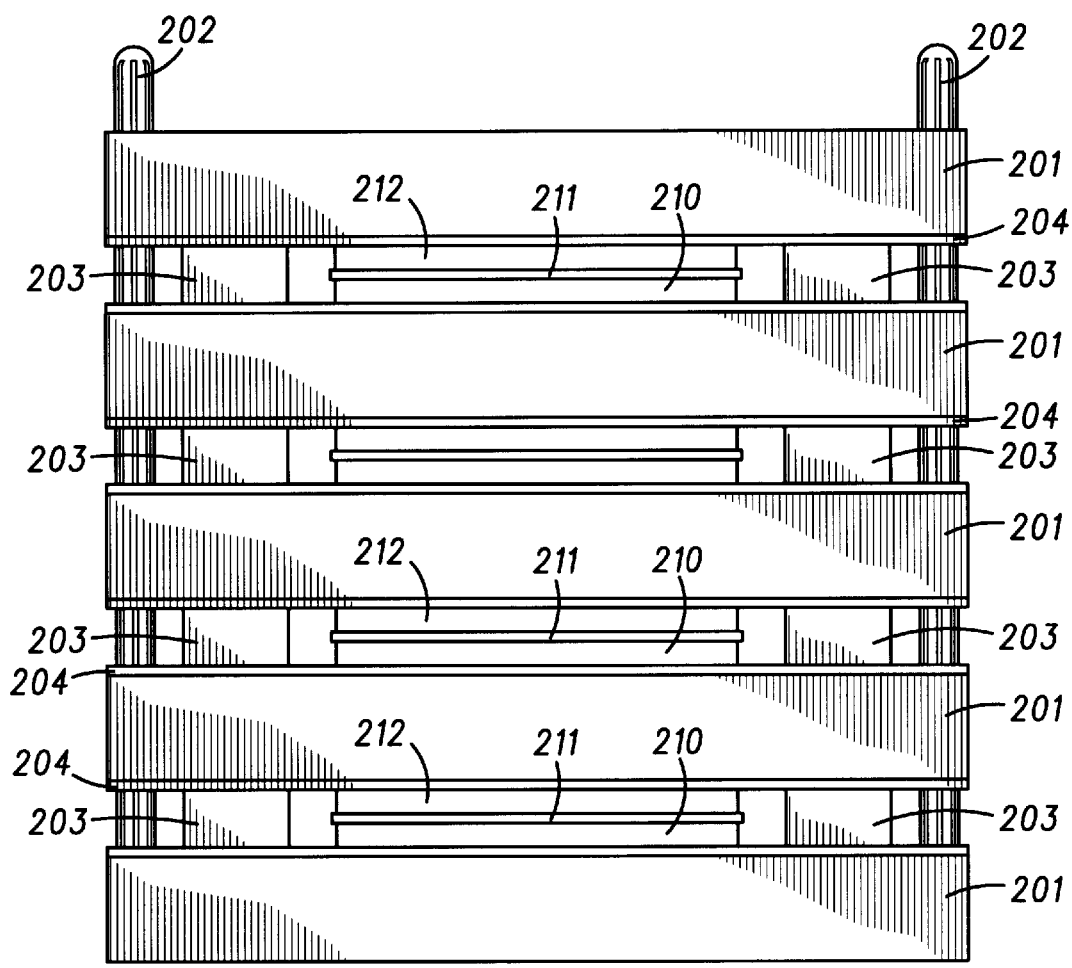
FIG. 2 illustrates a side view of an embodiment of an apparatus for manufacturing semiconductor components in accordance with the present invention.
Figure 3:
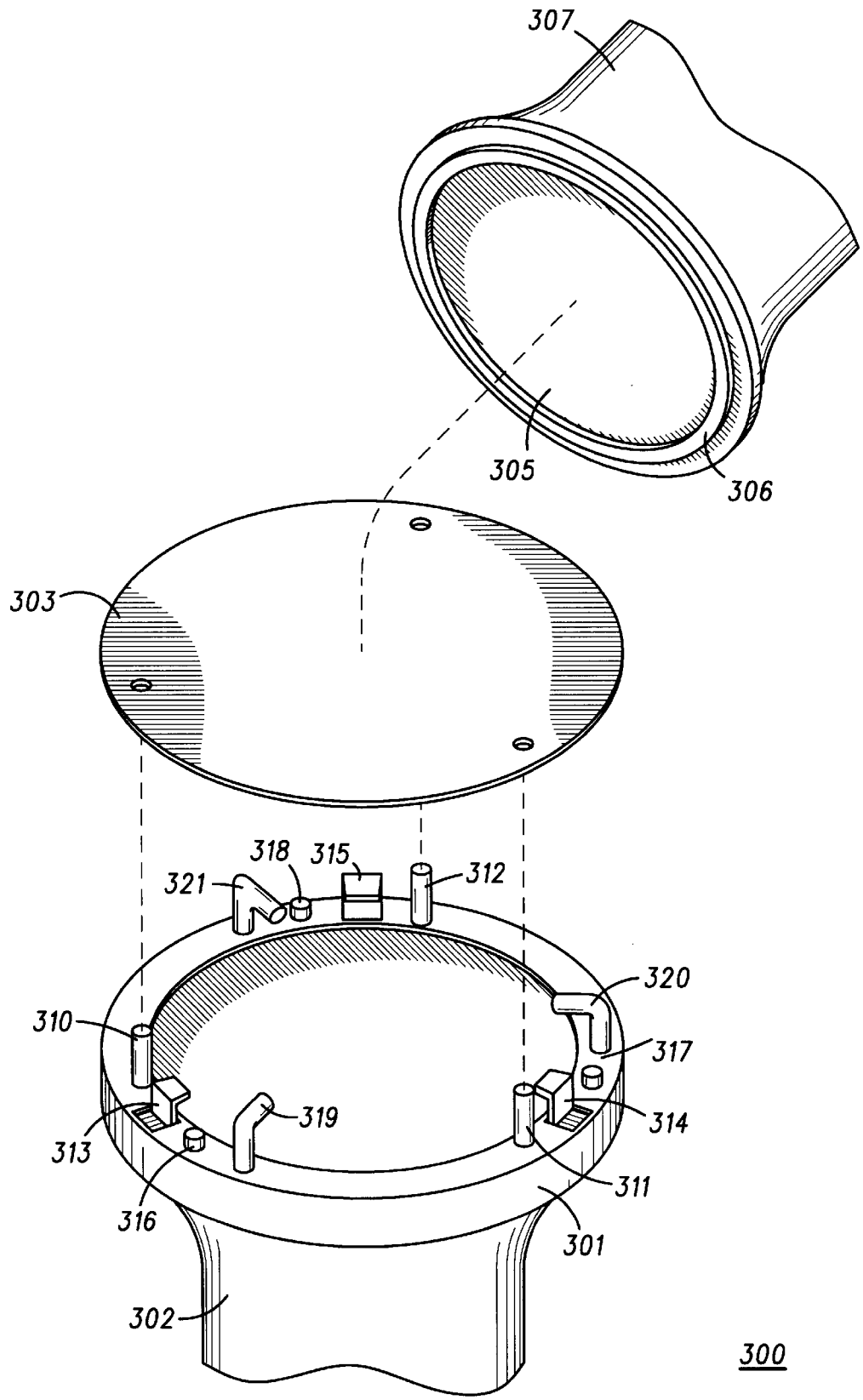
FIG. 3 illustrates an exploded view of an embodiment of another apparatus for manufacturing semiconductor components in accordance with the present invention.

Two different embodiments represented in FIGS. 2 and 3 can achieve the above-described encapsulation quality.

FIG. 2 illustrates a side view of an embodiment of an apparatus 200 for manufacturing semiconductor components, which can simultaneously produce a multitude of wafer-encapsulant-cap structures. Apparatus 200 can be used to perform a portion of the bonding step 108 in FIG. 1. Apparatus 200 is used to ensure that step 108 produces a composite structure having a uniform total thickness. Apparatus 200 includes, posts 202, platens 201 aligned by posts 202, and interposers or shims 203 between platens 201.

Platens 201 can be heated to approximately sixty to seventy degrees Celsius before semiconductor wafers 210, encapsulants 211, and capping wafers 212 are loaded onto platens 201. Wafers 210 include a semiconductor substrate or semiconductor wafer supporting a plurality of semiconductor devices and an electrical interconnect structure, as earlier described with reference to steps 101, 102, and 103 in FIG. 1. Packaging materials or encapsulants 211 are previously disposed over wafers 210 and are previously degassed, as earlier described with reference to steps 106 and 107 in FIG. 1. Capping wafers 212 also are positioned onto encapsulants 211 before being loaded into apparatus 200. In the preferred embodiment, capping wafers 212, encapsulants 211, and wafers 210 are positioned together before being placed in a vacuum chamber. While in the vacuum chamber, pressure is applied onto capping wafers 212 to eliminate any gaps between capping wafers 212 and encapsulants 211. The vacuum chamber eliminates void formation in encapsulants 211. After being removed from the vacuum chamber, these composite structures are loaded onto apparatus 200.

After being loaded onto apparatus 200, the composite structures of wafers 210 and 212 and encapsulant 211 are subjected to a contact force of approximately twenty to two hundred fifty kilograms for approximately one to five minutes. Apparatus 200 can be heated to approximately fifty to eighty degrees Celsius while the contact force is applied in order to lower the viscosity of encapsulants 211.

Optional plastic films 204 can be adhered to wafer 212 and located between wafer 212 and platen 201 and can also be adhered to wafer 210 and located between wafer 210 and platen 201. Films 204 prevent any excess encapsulant 211 that is squeezed out from between wafers 210 and 212 from contacting apparatus 200. By adhering films 204 to wafers 210 and 212, the excess encapsulant will not be able to wick into any small gaps between films 204 and wafers 210 or between films 204 and wafers 212 to cause thickness variations in the composite structure. Films 204 can be similar to ultraviolet sensitive tape that is typically used in wafer sawing processes.

Interposers or shims 203 are placed between platens 201 to maintain a minimum vertical spacing between the adjacent platens. Shims 203 prevent all of encapsulant 211 from being squeezed out from between wafers 210 and 212. Shims 203 define a total or composite thickness of wafer 210, encapsulant 211 and wafer 212.

After the contact force is released, the composite structures are subsequently removed from apparatus 200, and encapsulant 211 is cured as described in step 110 of FIG. 1.

FIG. 3 illustrates an exploded view of an apparatus 300 for manufacturing semiconductor components. Apparatus 300 automates steps 107 and 108 of method 100 in FIG. 1. Apparatus 300 includes a chamber that houses a bottom platen 301, which is heated from underneath using a heater 302. Platen 301 can be made of a metal such as aluminum, steel, or the like. The chamber can repeatably sustain vacuum levels of up to $1 \times 10^{-3}$ Torr. Platen 301 has alignment pegs or pins 310, 311, and 312 to control the horizontal position a semiconductor device wafer.

Apparatus 300 can control the thickness of the encapsulant between the wafer and the cap or can alternatively control the total thickness of the wafer-encapsulant-cap structure. The thickness of the encapsulant can be controlled by using finely precision ground, mechanically moveable flags 313, 314, and 315. Flags 313, 314, and 315 can be approximately one hundred micrometers thick. The total thickness of the wafer-encapsulant-cap structure can be controlled by using stand-offs or precision ground stops 316, 317, and 318 machined as part of platen 301. Stops 316, 317, and 318 can be approximately one thousand micrometers in height.

Apparatus 300 also has three retractable separation flags 319, 320, and 321 attached to platen 301. Flags 319, 320, and 321 help separate the wafer and the cap prior to the bonding process of step 108 in FIG. 1. Flags 319, 320, and 321 provide a gap of approximately six hundred micrometers between the wafer and the cap prior to bonding step 108 in FIG. 1.

Apparatus 300 also has a top platen 303, which can be made of a rigid material such as, for example, glass. Top platen 303 has openings corresponding to wafer alignment pins 310, 311, and 312. In one embodiment, platen 303 has additional holes corresponding to the location of stops 316, 317, and 318 to produce wafer-encapsulant-cap structures with uniform encapsulant thicknesses controlled by flags 313, 314, and 315. In a different embodiment, platen 303 is used to control the overall thickness of the wafer-encapsulant-cap structure and does not have any additional holes. In this different embodiment, stops 316, 317, and 318 maintain a minimum distance between platens 301 and 303.

Apparatus 300 also contains a pressure head 305, which has a layer 306 of a soft or compliant material such as graphite and which also has a heater 307. Pressure head 305 can repeatably apply pressures of twenty to two hundred fifty kilograms onto platen 303. The purpose of layer 306 is to uniformly distribute the pressure applied by pressure head 305. If necessary for curing the encapsulant, pressure head 305 could be heated by a heater 307, which can be similar to heater 302. Heaters 302 and 307 can heat platens 301 and 303 up to temperatures of approximately two hundred fifty degrees Celsius.

Separation flags 319, 320, and 321 and pressure head 305 can be moved using external commands from an automated driver controlled by a computer. The pressure applied, the manner in which the pressure is applied, the process of evacuating the chamber, and the heating of platens 301 and 303 can also be precision controlled by a computer.

After step 106 of method 100 in FIG. 1, the wafer with the applied encapsulant is loaded inside the chamber of apparatus 300 and placed on bottom platen 301 in between alignment pins 310, 311, and 312. Then, separation flags 319, 320, and 321 are inserted over the positioned wafer. Subsequently, the cap is loaded and positioned using alignment pins 310, 311 and 312 to be above the wafer. Then, depending on the desired thickness control method, one of the two previously described embodiments of top platen 303 is placed on top of the cap and is also positioned by pins 310, 311, and 312. Top platen 303 is supported over the cap by separation flags 319, 320, and 321. Top platen 303 helps secure the wafer and the cap onto bottom platen 301. The chamber is then closed and evacuated to a vacuum of approximately $1 \times 10^{-3}$ Torr in less than approximately one minute. Bottom platen 301 is simultaneously heated using heater 302 to a temperature of approximately eighty to one hundred degrees Celsius. The vacuum is maintained for an additional one to five minutes to complete degassing step 107 in FIG. 1. Subsequently, separation flags 319, 320, and 321 are retracted; the cap is brought into contact with the encapsulant; and a pressure of approximately twenty to two hundred fifty kilograms is applied on platen 303 by pressure head 305 for approximately one to five minutes. The elevated temperature in the chamber can be maintained above room temperature during this bonding or capping step enabling gelation of the encapsulant.

After the bonding process is completed, the vacuum in the chamber is broken, and then the contact force is released. The bonded composite structure is removed from apparatus 300 and the chamber; the excess encapsulant is removed from the composite structure as described in step 109 of FIG. 1; and the encapsulant is cured as described in step 110 of FIG. 1.

Optional plastic films (not illustrated in FIG. 3, but similar to films 204 in FIG. 2) can be adhered to the cap and located between the cap and platen 303 and can also be adhered to the semiconductor wafer and located between the wafer and platen 301. The films prevent any excess encapsulant that is squeezed out from between the wafer and the cap during the bonding step from contacting apparatus 300. By adhering the films to the wafer and the cap, the excess encapsulant will not be able to wick into any small gaps between the film and the wafer or between the film and the cap to cause thickness variations in the composite structure. The films can be similar to ultraviolet sensitive tape that is typically used in wafer sawing processes.

Conduction heating from bottom platen 301 and from top platen 303, if needed, provides uniform heating of the encapsulant. Layer 306 helps to uniformly distribute the pressure applied by pressure head 305 to top platen 303 and onto the wafer-encapsulant-cap structure. The formation of a vacuum environment prior to bringing the cap in contact with the encapsulant eliminates void formation underneath the metallic interconnects and in the encapsulant between the wafer and the cap.

Figure 4:
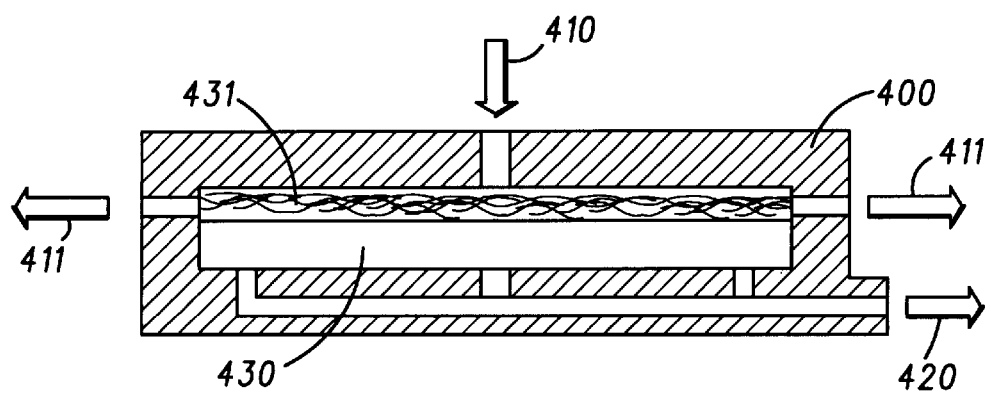
FIG. 4 illustrates a cross-sectional view of an embodiment of yet another apparatus for manufacturing semiconductor components in accordance with the present invention.

FIG. 4 illustrates a cross-sectional view of an embodiment of an apparatus 400 for manufacturing semiconductor components. Apparatus 400 molds a packaging material or encapsulant over a wafer 430. Wafer 430 includes a semiconductor substrate or semiconductor wafer supporting a plurality of semiconductor devices and an electrical interconnect structure. Vacuum 420 keeps wafer 430 stationary in apparatus 400 during the encapsulation or packaging process. An optional fiber reinforced mat or layer 431 can be disposed over wafer 430 in apparatus 400 to increase the strength of the final semiconductor component. Layer 431 can replace capping wafer 212 of FIG. 2. Layer 431 can be comprised of a fiber reinforcement such as, for example, an Aramid(™) cloth manufactured by the DuPont Corporation of Wilmington, Del.

A vacuum is first created within apparatus 400 by closing an input port and applying a suction force 411 at the output ports. After creating the vacuum, a packaging material or encapsulant can be heated to approximately eighty to ninety degrees Celsius and directed into apparatus 400 by a force 410 of less than approximately $3.5 \times 10^5$ Newtons per square meter ($N/m^2$). This force is significantly less than the required force of $7 \times 10^7$ $N/m^2$ for conventional injection molding or $7 \times 10^6$ $N/m^2$ for conventional transfer molding. A clamping force of less than approximately $1 \times 10^6$ $N/m^2$ for apparatus 400 during the molding process is also significantly less than the required force of $7 \times 10^8$ $N/m^2$ for injection molding and $3 \times 10^8$ $N/m^2$ for transfer molding. The lower forces simplify the manufacturing process and improve the manufacturing yield.

The packaging material is disposed into or impregnates fiber reinforced layer 431 to form a fiber reinforced composite layer. The packaging material also encapsulates or packages wafer 430 by physically coupling together wafer 430 and layer 431. The recess in apparatus 400 that holds wafer 430 and layer 431 determines the final height of the encapsulated structure. Excess packaging material is removed from apparatus 400 by suction force 411. When apparatus 400 is filled with the packaging material, force 411 is turned off, and the output ports are closed while force 410 is remains on to maintain a pressure within apparatus 400. After an appropriate curing process, as specified by step 110 in FIG. 1, and after forming additional interconnect structures in step 111 of FIG. 1, the plurality of semiconductor devices are singulated from the semiconductor wafer in step 112 of FIG. 1.

In an alternative embodiment, wafer 430 is encapsulated without using layer 431, and an optional "prepreg" or pre-impregnated layer or B-staged composite layer (not illustrated in FIG. 4) can be disposed over the packaging material. The "prepreg" layer replaces capping wafer 212 of FIG. 2. Then, the encapsulant and the "prepreg" layer are cured before wafer 430 is sawed into individual semiconductor components.

Therefore, an improved semiconductor component and method of manufacture is provided to overcome the disadvantages of the prior art. The method of manufacture eliminates voids in the encapsulant, uniformly controls the thickness or height of the semiconductor component, does not produce warped wafers, and improves the adhesion between the encapsulant and the wafer. The semiconductor component and method of manufacture described herein does not use glass or oxides to bond the semiconductor wafer and the cap together, as known in the prior art of wafer-to-wafer bonding. The prior art glass and oxide bonding techniques do not provide the thickness and planarity tolerances achieved by the methods disclosed herein.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the time, pressure, and temperature ranges are provided to facilitate the understanding of the present invention and are not provided to limit the scope of the invention. Furthermore, instead of using shims 203 in FIG. 2, apparatus 200 can use tabs between wafers 210 and 212 to maintain a composite thickness by controlling the final thickness of encapsulant 211.

Accordingly, the disclosure of the present invention is not intended to be limiting. Instead, the disclosure of the present invention is intended to be illustrative of the scope of the invention, which is set forth in the following claims.

What is claimed is:

1. A method of manufacturing a semiconductor component comprising:

applying a packaging material to a wafer;

degassing the packaging material after the applying step; and separating the wafer into a plurality of semiconductor components after the degassing step.

2. The method of claim 1 further comprising curing the packaging material after the degassing step and before the separating step.

3. The method of claim 1 further comprising irradiating the wafer with ultraviolet light before the applying step.

4. The method of claim 1 further comprising exposing the wafer to ozone before the applying step.

5. The method of claim 4 wherein the exposing step further comprises heating the wafer to a temperature of approximately forty to eighty degrees Celsius.

6. The method of claim 1 wherein the applying step further comprises stencil printing a silicone material over the wafer.

7. The method of claim 1 wherein the degassing step further comprises heating the wafer to a temperature of approximately sixty to seventy degrees Celsius.

8. The method of claim 1 wherein the degassing step further comprises degassing the packaging material in a vacuum.

9. The method of claim 1 further comprising coupling a capping wafer to the wafer after the step of applying a packaging material.

10. The method of claim 9 wherein the coupling and degassing steps occur in a chamber under vacuum and at a temperature above room temperature.

11. A method of manufacturing a semiconductor component comprising:

providing a semiconductor wafer;

manufacturing a plurality of semiconductor devices in the semiconductor wafer;

forming an electrical interconnect structure over the semiconductor wafer;

cleaning exposed portions of the electrical interconnect structure and the semiconductor wafer;

applying an encapsulant onto the electrical interconnect structure and the semiconductor wafer;

degassing the encapsulant;

bonding a cap to the encapsulant in a vacuum;

curing the encapsulant; and singulating one of the plurality of semiconductor devices from the semiconductor wafer.

12. The method of claim 11 wherein the cleaning step further comprises exposing the exposed portions of the electrical interconnect structure and the semiconductor wafer to ultraviolet light and ozone at a temperature of approximately forty to eighty degrees Celsius.

13. The method of claim 11 wherein the applying step further comprises stencil printing a material selected from the group consisting essentially of a silicone resin or an epoxy and further comprising:

disposing an adhesion promoter onto the exposed portions of the electrical interconnect structure and the semiconductor wafer after the cleaning step and before the applying step; and removing excess encapsulant from an edge of the semiconductor wafer after the bonding step and before the curing step.

14. The method of claim 11 wherein the degassing step further includes heating the encapsulant in a vacuum to a temperature of approximately sixty to seventy degrees Celsius.

15. The method of claim 11 wherein the bonding step further comprises using a shim to define a thickness of the encapsulant.

16. The method of claim 15 wherein the degassing and bonding steps occur in a chamber under vacuum.

17. A method of manufacturing a semiconductor component comprising:

providing a wafer supporting a plurality of semiconductor devices;

encapsulating the wafer to package the plurality of semiconductor devices; and singulating the plurality of semiconductor devices from the wafer after the encapsulating step.

18. The method of claim 17 wherein the encapsulating step further comprises:

disposing a fiber reinforcement layer over the wafer;

disposing a packaging material into the fiber reinforcement layer; and using the packaging material to physically couple the fiber reinforcement layer to the wafer.

19. The method of claim 17 further comprising:

disposing a prepreg layer over the wafer after the encapsulating step and before the singulating step; and curing the prepreg layer after the disposing step and before the singulating step.

* * * * *